United States Patent [19]
Telser et al.

[11] Patent Number: 6,037,101
[45] Date of Patent: Mar. 14, 2000

[54] PHOTOSENSITIVE MIXTURE AND RECORDING MATERIAL PRODUCED THEREFROM

[75] Inventors: Thomas Telser, Weinheim; Stefan Wegener, Mainz; Sabine Philipp, Mörfelden-Walldorf; Hartmut Sandig, Frankenthal, all of Germany

[73] Assignee: BASF Drucksysteme GmbH, Muenster, Germany

[21] Appl. No.: 09/055,721

[22] Filed: Apr. 7, 1998

[51] Int. Cl.⁷ .................................................. G03C 1/725
[52] U.S. Cl. ...................... 430/286.1; 430/325; 430/306
[58] Field of Search ...................... 101/401.1; 430/281.1, 430/306, 907, 325, 286.1

[56] References Cited

U.S. PATENT DOCUMENTS

| | | | |
|---|---|---|---|
| 3,453,311 | 7/1969 | Miller | 260/453 |
| 3,884,693 | 5/1975 | Bauer et al. | 96/15 |
| 4,072,527 | 2/1978 | Fan | 96/87 |
| 4,162,919 | 7/1979 | Richter et al. | 96/67 |
| 4,320,188 | 3/1982 | Heinz et al. | 430/281 |
| 4,323,636 | 4/1982 | Chen et al. | 430/271 |
| 4,423,135 | 12/1983 | Chen et al. | 430/271 |
| 4,855,140 | 8/1989 | Seppelt et al. | 424/405 |
| 4,994,344 | 2/1991 | Kurtz et al. | 430/273 |
| 5,185,234 | 2/1993 | Nakatsukasa et al. | 430/284 |
| 5,348,844 | 9/1994 | Garmong | 430/286 |
| 5,731,129 | 3/1998 | Koshimura et al. | 430/286.1 |

FOREIGN PATENT DOCUMENTS

| | | |
|---|---|---|
| 084851 | 8/1983 | European Pat. Off. . |
| 2823300 | 5/1978 | Germany . |
| 62/287234 | 12/1987 | Japan . |
| 09087591 | 3/1997 | Japan . |

OTHER PUBLICATIONS

"Chemistry of the Graphic Arts", Hartsuch, P.J., 1979, Graphic Arts Technical Foundation, Pittsburgh, PA, pp. 215,223,231–233,240–244.

Derwent and European Patent Office internet esp@cenet abstracts of JP 62–287234.

*Primary Examiner*—Janet Baxter
*Assistant Examiner*—Rosemary Ashton
*Attorney, Agent, or Firm*—Keil & Weinkauf

[57] ABSTRACT

A photosensitive recording material having a dimensionally stable substrate and a photosensitive layer which is applied thereon and contains A) an elastomeric block copolymer as a binder,
B) a polymerizable compound and
C) a compound capable of initiating the polymerization of the compound B under the action of actinic radiation, is described, the elastomeric block copolymer A being a block copolymer having blocks of polymerized 1. styrene units,
2. alkylene units and
3. diene units.

The material is suitable for the production of relief printing plates, especially flexographic printing plates, which are distinguished by higher resistance to swelling in the presence of printing inks containing ester solvents or UV-curable components.

10 Claims, No Drawings

PHOTOSENSITIVE MIXTURE AND RECORDING MATERIAL PRODUCED THEREFROM

The present invention relates to a photosensitive, in particular photopolymerizable, mixture and recording material which is produced therefrom and is suitable for the production of relief printing plates, especially for flexographic printing.

Recording materials of the stated generic type generally have a photopolymerizable layer which contains a polymeric binder, a polymerizable compound, a photopolymerization initiator and, if required, further conventional components.

In general, elastomeric binders, such as block copolymers, for example three-block copolymers with styrene-isoprene-styrene blocks or styrene-butadiene-styrene blocks, as described, for example, in DE-A 22 15 090, are preferred for the production of flexographic printing plates. The three-block copolymers may be used as the sole elastomers or in combination with two-block copolymers, for example styrene-isoprene or styrene-butadiene two-block copolymers. The preparation generally gives a mixture of three-block copolymers and two-block copolymers.

Three-block copolymers comprising styrene-isoprene-styrene/butadiene, in which the third block is randomly composed of styrene and butadiene units, are described in EP-A 0 027 612.

Printing plates which contain these elastomers as binders are flexible and resilient and can therefore be very readily used in flexographic printing. They are resistant to printing inks based on water or alcohols as solvents. Print runs of more than 1 million are achieved.

However, such printing plates are less suitable if UV-curable printing inks or printing inks based on ester-containing alcohols as solvents are to be used for printing. Esters such as ethyl acetate or propyl acetate are frequently added to alcohol-based printing inks in order to achieve more rapid drying of the ink or to effect better wetting of critical printing materials, such as polyester or polyvinyl chloride films or aluminum foils. Recently, UV-curable printing inks have been increasingly used since they permit better print quality. Printing inks curable by means of free radicals or cationically crosslinkable printing inks are used here.

EP-A 0 326 977 describes photosensitive recording materials for the production of flexographic printing plates, which contain terpolymers of randomly distributed ethylene, propylene and alkadiene units as binders. Owing to the low polarity of these binders, the flexographic printing plates described there have higher resistance to swelling compared with printing inks containing ester solvents; however, their surface is too tacky and their resolution is low. The field of use of the flexographic printing plates is thus greatly restricted.

It is an object of the present invention to provide photosensitive recording materials for the production of relief printing plates, in particular flexographic printing plates, which have better resistance to swelling by UV-curable printing inks and alcohol-based printing inks containing ester solvents and at the same time achieve the resolution of the best currently known flexographic printing plates based on binders comprising styrene-isoprene-styrene or styrene-butadiene-styrene three-block copolymers.

We have found that this object is achieved, according to the invention, by a photosensitive mixture which contains A) an elastomeric block copolymer as a binder,
B) a polymerizable compound and
C) a compound capable of initiating the polymerization of the compound B under the action of actinic radiation.

In the novel mixture, the elastomeric block copolymer A is a copolymer having blocks of polymerized 1. styrene units,
2. alkylene units and
3. diene units.

According to the invention, a photosensitive recording material having a dimensionally stable substrate and a photosensitive, in particular photopolymerizable, layer applied thereon is also proposed, wherein the photosensitive layer consists of a mixture of the abovementioned composition.

The blocks of alkylene units can be prepared by polymerization of olefins, for example of ethylene, propylene, butylene, hexylene and similar monoolefins, or by hydrogenation of diene polymer blocks prepared beforehand, for example of polybutadiene. The hydrogenation can be carried out in an elegant manner on the prepared block copolymers having blocks of styrene units, isoprene units and butadiene units by selectively hydrogenating the butadiene blocks. The hydrogenation of the butadiene units is effected virtually quantitatively whereas the isoprene units remain virtually unchanged. Depending on whether the butadiene units in the polymer have been formed by 1,2 or 1,4 addition, ethylene or 1,2-butylene units are formed in the hydrogenation. The original block copolymer of styrene, butadiene and isoprene blocks can be prepared by linking isoprene blocks prepared beforehand with block copolymers prepared beforehand and comprising a styrene and a butadiene block by means of suitable polyfunctional coupling agents, for example polyhaloalkanes. For example, two isoprene blocks in each case can be linked to two styrene-butadiene block copolymers in each case via a central tetrafunctional coupling agent to give a star block copolymer. The preparation of such polymers is known and corresponding products are commercially available.

The particular resistance of the printing plates produced from the novel mixtures or recording materials to printing inks which contain esters as solvent components or liquid unsaturated UV-curable components is presumably due to the special binders contained in the mixtures and having a combination of hard phases (polystyrene blocks) with different soft phases (polydiene and polyolefin blocks).

The mixtures contain in general from 50 to 95, preferably from 70 to 95, % by weight, based on the total amount of binders and polymerizable compounds, of binder A.

The novel mixtures furthermore contain compounds or monomers B polymerizable in a known manner. The monomers should be compatible with the binder and have at least one polymerizable ethylenic double bond: suitable monomers generally have a boiling point of more than 100° C. at atmospheric pressure and a molecular weight of up to 3000, preferably up to 2000. Esters or amides of acrylic or methacrylic acid, styrene or substituted styrenes, esters of fumaric or maleic acid or allyl compounds have proven particularly advantageous. Suitable monomers are stated in EP-A 0 326 977. The mixtures generally contain from 5 to 50, preferably from 5 to 30, % by weight, based on the total amount of binder A and monomers B, of polymerizable monomers B.

Suitable initiators C for the photopolymerization include benzoin or benzoin derivatives, such as α-methylbenzoin or benzoin ethers, benzil derivatives, such as benzil ketals, acylarylphosphine oxides, acylarylphosphinic esters or sodium acylarylphosphinates, polynuclear quinones or benzophenones. The mixture contains in general from 0.1 to 5% by weight, based on the amount of A+B, of photoinitiators.

The novel mixtures may furthermore contain conventional assistants, especially plasticizers, thermal polymerization inhibitors, dyes, pigments, photochromic additives, agents for improving the relief structure, crosslinking agents, antioxidants, antiozonants, fillers, flow improvers or mold release agents. Their amount should not exceed 40% by weight of the total mixture.

Examples of plasticizers are modified and unmodified natural oils and natural resins, alkyl, alkenyl, arylalkyl or arylalkenyl esters of acids, such as alkanoic acids, arylcarboxylic acids or phosphoric acid; synthetic oligomers or resins, such as oligostyrene, oligomeric styrene-butadiene copolymers, oligomeric α-methylstyrene/p-methylstyrene copolymers, liquid oligobutadienes or liquid oligomeric acrylonitrile-butadiene copolymers; and polyterpenes, polyacrylates, polyesters or polyurethanes, polyethylene, ethylene-propylene-diene rubbers or ω-methyl-oligo (ethylene oxide).

Examples of particularly suitable plasticizers are paraffinic mineral oils; esters of dicarboxylic acids, such as dioctyl adipate or dioctyl terephthalate; naphthenic plasticizers or polybutadienes having a molecular weight of from 500 to 5000. Amounts of from 5 to 50% by weight, based on the weight of the total mixture, are advantageous.

Thermal polymerization inhibitors are generally added in an amount of from 0.001 to 2% by weight, based on the same quantity as above. Examples are hydroquinone, p-methoxyphenol, 2,6-di-tert-butyl-p-cresol, β-naphthol, phenothiazine, pyridine, nitrobenzene, m-dinitrobenzene or chloranil; thiazine dyes, such as Thionine Blue G (C.I. 52025), Methylene Blue B (C.I. 52015) or Toluidine Blue (C.I. 52040); and N-nitrosamines.

Dyes, pigments or photochromic additives can be added in an amount of from 0.0001 to 2% by weight. They serve for controlling the exposure properties, for identification, for direct monitoring of the result of exposure or for esthetic purposes. A precondition for the choice and the amount of such additives is that—like the inhibitors—they do not interfere with the photopolymerization of the mixtures. For example, the soluble phenazinium, phenoxazinium, acridinium and phenothiazinium dyes are suitable. These dyes are also used together with a sufficient amount of a reducing agent which does not reduce the dye in the absence of actinic light but is capable of reducing the dye in the excited electronic state on exposure. Examples of such mild reducing agents are ascorbic acid, anethole, N-allylthiourea and salts of N-nitrosocyclohexylhydroxylamine. As stated, the latter can simultaneously serve as thermal polymerization inhibitors.

The reducing agents are generally added in amounts of from 0.005 to 5% by weight, the addition of from 3 to 10 times the amount of dye having proven useful in many cases.

Examples of crosslinking assistants are tri- and tetrafunctional thiol compounds.

Examples of antioxidants are sterically hindered monophenols, such as 2,6-di-tert-butyl-p-cresol; alkylated thiobisphenols and alkylated alkylidenebisphenols; hydroxybenzenes, such as 1,3,5-trimethyl-2,4,6-tris(3,5-di-tert-butyl-4-hydroxybenzyl)benzene; triazines; zinc butyldithiocarbamate; dilaurylthiodipropionate; or phosphites, such as tris(nonylphenyl) phosphite. Amounts of from 0.0001 to 5% by weight are advantageous.

Examples of polymeric or nonpolymeric organic and inorganic fillers or reinforcing fillers are those which are essentially transparent to the wavelengths of the light used for exposure of the novel recording materials, do not scatter this light and are substantially adapted to the relevant novel mixture in their refractive index, for example polystyrene, organophilic silicon dioxide, bentonite, silica, organophilic aluminum oxide, glass powder, colloidal carbon and other pigments.

An example of a flow improver is calcium stearate. An example of a mold release agent is talc.

Examples of antiozonants are the conventional and known antiozonant waxes and the chloroalkanes of 8 to 40 carbon atoms containing from 30 to 73% by weight of chlorine in the molecule.

Examples of agents for improving the relief structure of relief printing plates produced from the novel recording materials are, for example, 9,9'-dianthronyl and 10,10'-bisanthrone.

The thickness of the photopolymerizable relief-forming layer depends primarily on the intended use of the novel recording materials. Thus, the thickness varies in general from 0.001 to 7, preferably from 0.1 to 7, in particular from 0.7 to 6.5, mm, because the novel recording materials are suitable for various printing techniques.

In addition to the photopolymerizable layer, the novel recording material may contain further layers or sheet-like structures which are useful for its function.

Thus, the photopolymerizable layer may be bonded to the dimensionally stable substrate permanently or in a readily detachable manner. The substrate in turn may be underlaid with a resilient and flexible lower layer. Furthermore, a permanent bond can be achieved between the substrate and the photopolymer layer with the aid of an adhesion-promoting layer. If the substrate is bonded to the photopolymer layer in a readily detachable manner, it is also referred to as a temporary substrate.

Panels, sheets or conical or cylindrical sleeves of metals, such as steel, aluminum, copper or nickel, or of plastics, such as polyethylene terephthalate, polyamide or polycarbonate, may be used as dimensionally stable substrates. Woven fabrics and nonwovens, such as glass-fiber fabrics or composites comprising glass fibers and plastics, are also suitable.

The adhesion-promoting layers used are advantageously conventional and known, about 0.5–40 μm thick layers comprising a mixture of adhesive-forming components.

If highly reflective panels or sheets are used as the substrate they may contain suitable antihalation agents, such as carbon black or manganese dioxide. However, the antihalation agents may also be applied as a separate layer to the substrate or may be present in the adhesion-promoting layer or in the photopolymer layer.

Moreover, the novel recording material may contain a smooth or dull, nontacky release layer which is transparent to light, soluble or swellable in the developers for the photopolymer layer, more firmly bonded to the photopolymer layer than to any cover sheet and formed by a polymer forming strong films and any additives contained therein.

Examples of suitable polymers forming strong films are polyamides, completely or partially hydrolyzed polyvinyl acetates or polyethylene oxide/vinyl acetate graft polymers, copolyamides, polyurethanes, poly(meth)acrylates, polyvinyl alcohol alkanecarboxylates having a degree of hydrolysis of from 30 to 99%, cyclized rubbers having a high degree of cyclization, ethylene/propylene copolymers, homo- and copolymers of vinyl chloride or ethylene/vinyl acetate copolymers.

Examples of suitable release layers which contain additives are disclosed in U.S. Pat. No. 4,162,919, DE-A 28 23 300, DE-B 21 23 702, U.S. Pat. No. 4,072,527, U.S. Pat. No 3,453,311 or DE-A 37 32 527.

In general, the release layers are from 0.2 to 25 μm thick.

Furthermore, the novel recording material may contain a cover sheet which can be readily detached from the photopolymerizable layer or from the release layer.

Cover sheets are from 10 to 250 μm, in particular from 20 to 150 μm, thick. They essentially consist of plastics, textile materials, papers or metals. That surface of the cover sheet which rests directly on the release layer is smooth, ie. it has a surface roughness $R_{max}$ of $\leq 0.1$ μm, or dull, ie. it has a surface roughness $R_{max}$ of from 0.1 to 15 μm, preferably from 0.3 to 10 μm, in particular from 0.5 to 7 μm. If the cover sheet is dull, its roughness pattern becomes embossed in the release layer and possibly also in the photopolymerizable layer. This smooth or dull surface of the cover sheet may furthermore be made antiadhesive, ie. it may have, for example, a 0.1–0.5 μm thick antiadhesion layer comprising silicones or comprising other plastics, such as polyethylene or polypropylene.

Examples of particularly advantageous cover sheets are 20–150 μm thick, smooth or dull, biaxially oriented polyethylene terephthalate films which may have been made antiadhesive.

In all cases, the photopolymerizable layer may be composed of photopolymerizable part-layers. These part-layers may be of the same, roughly the same or different composition. The layer composed of part-layers can be produced by the method stated in EP-A 0 084 851.

The particular advantages of the novel recording materials are revealed in a convincing manner in their use for the production of relief printing plates, in particular flexographic printing plates. The production of the relief printing plates from the novel recording materials usually comprises the following operations:

a) if required, pretreatment of the novel recording materials, b) if required, removal of the cover sheet from any release layer present, c) superposition of an image mask or photographic negative, d) imagewise exposure of the photopolymerizable layer to actinic light having a wavelength of from 230 to 450 nm, in particular from 350 to 450 nm, e) washing out (development) of the unexposed parts of the imagewise exposed layer by means of suitable developers, any release layer present also being washed away, f) drying and g) if required, aftertreatment of the relief printing plates obtained in this manner and now containing the relief layer or consisting thereof.

The thickness of the relief layer varies from 0.1 to 7 mm, in particular from 0.7 to 6.5 mm, depending on the intended use of the relief printing plates.

A conventional method of pretreatment is the uniform exposure of the recording material from the back to actinic light. Back is to be understood here as meaning that side which faces away from the subsequently formed relief layer.

Suitable sources of actinic light are commercial UV fluorescence tubes, medium pressure, high pressure and low pressure mercury lamps, superactinic fluorescent tubes, pulsed xenon lamps, lamps doped with metal iodides or carbon arc lamps.

Examples of suitable organic developers are aliphatic or aromatic hydrocarbons, such as n-hexane, n-heptane, octane, petroleum ether, naphtha, limonene or other terpenes, toluene, xylene, ethylbenzene or isopropylbenzene, or mixtures of these solvents; ketones, such as acetone or methyl ethyl ketone; ethers, such as di-n-butyl ether; esters, such as ethyl acetate, halogenated aliphatic hydrocarbons, such as methylene chloride, chloroform, trichloroethane, tetrachloroethylene, di-chlorotetrafluoroethane or trichlorotrifluoroethane; or mixtures which contain two or more of these solvents; or mixtures which contain one or more of these solvents and additionally alcohols, such as methanol, ethanol, isopropanol or n-butanol; or solvents and mixtures of the stated type which additionally contain solid, liquid or gaseous organic and inorganic compounds, such as surfactants, in minor amounts.

Conventional methods of aftertreatment of the relief images or printing plates comprise uniform postexposure to actinic light having wavelengths of from 150 to 450 nm or treatment with halogen-containing solutions.

If the novel recording materials are subjected to this process, they prove to be rapidly exposable, their exposure latitude being extremely large, true to detail in the reproduction of even very fine and therefore critical image subjects of the image masks or photographic negatives and extremely stable to washout, so that the development conditions can safely be made more stringent for reducing the development times.

As a result, the cycle times in the production of relief printing plates and photoresists are shorter, which is a considerable advantage for operation in practice. This advantage is particularly important in the production of flexographic printing plates.

During printing on a conventional and known flexographic printing unit, the printing plates obtained from the novel recording materials exhibit pronounced stability to printing inks which contain esters and/or ketones and to UV-curable printing inks. In addition, the novel flexographic printing plates are substantially more stable to ozone than the prior art flexographic printing plates. Moreover, the novel flexographic printing plates can be reused several times without the quality of the printed products suffering as a result.

The Examples below describe preferred embodiments of the invention. Parts, ratios and percentages stated therein are by weight, unless stated is otherwise.

EXAMPLE 1

A solution of 78 parts of a styrene-ethylene/butylene-isoprene-styrene block copolymer containing 18% of styrene, 36% of isoprene and 46% of ethylene/1,2-butylene units (Kraton®G RP 6919), 10 parts of hexanediol diacrylate, 5 parts of liquid paraffin (white oil S 5000), 1 part of benzil dimethyl ketal and 1 part of di-tert-butyl-p-cresol in 150 parts of toluene was prepared by stirring at 80° C. The solution was poured onto a 125 μm thick polyethylene terephthalate film (Mylar®, du Pont de Nemours Co.). The film was coated beforehand with a thin release layer of about 5 μm comprising polyamide (Makromelt® 6900, Henkel KGa.A.). The solution was poured onto the film at 80° C. and then dried for 2 hours at 60° C. The layer was then dried in the air overnight. After drying and drying in the air, the thickness of the photosensitive layer was 700 μm. The composite comprising cover sheet, release layer and photosensitive layer was then laminated with a 125 μm thick substrate film comprising polyethylene terephthalate (Hostaphan® RN) and provided with a mixture of adhesive-forming components.

After a storage time of 1 week, a plate was produced from the printing plate. The following process steps were carried out:

a) removal of the protective film, b) superposition of a test film (nyloflex® FAR II, BASF)

c) stepwise imagewise main exposure under a vacuum film (F III exposure unit from BASF, exposure times from 2 to 20 minutes)

d) washing out of the plate down to the substrate film (continuous-flow system VF III from BASF, flow-through time 150 nm/min, developer nylosolv® II from BASF, 30° C., relief height 700 μm), e) drying for 2 hours at 65° C.

f) postexposure (F III exposure unit from BASF, 10 minutes)

g) aftertreatment with UV-C light (F III aftertreatment unit from BASF, 10 minutes)

The plate produced was evaluated. The exposure time required for correct formation of the test elements was determined. Furthermore, the Shore A hardness of the plate material was determined. Swelling measurements were carried out on the solid areas of the plate. For this purpose, a solid area measuring 5×5 cm was coated with the printing ink. After an action time of 24 hours, the printing ink was wiped off and the weight increase determined. The printing inks used were a printing ink curable by UV exposure on the basis of a free radical mechanism (Magenta Y 1635 C, Zeller-Gmelin) and a printing ink curable by UV exposure on the basis of a cationic mechanism (Magenta Q 1635 C, Zeller-Gmelin). The results are listed in Table 1.

EXAMPLE 2

A printing plate was produced according to Example 1. The components of the solution were:

68 parts of the block copolymer stated in Example 1, 10 parts of hexanediol diacrylate, 10 parts of dihydrodicyclopentadienyl acrylate, 5 parts of white oil S 5000, 1 part of benzil dimethyl ketal and 1 part of di-tert-butyl-p-cresol in 150 parts of toluene.

The printing plate was processed as in Example 1 to give a plate and was evaluated.

EXAMPLE V3

(Comparative Example)

A printing plate was produced according to Example 1. Instead of the block copolymer used there, a commercial styrene-isoprene-styrene three-block copolymer (Kraton® D 1161, Shell) having a styrene content of 15% and an isoprene content of 85% was used. The printing plate was processed to give a plate and was evaluated, these steps being carried out as in Example 1.

TABLE 1

|  | Example 1 | Example 2 | Example V3 |
| --- | --- | --- | --- |
| Required exposure time (minutes) | 14 | 8 | 16 |
| Shore A hardness (according to DIN 53505, 6 mm layer) | 62 | 66 | 62 |
| 24 h swelling value in ink polymerizable by free radical method (% by weight) | 0.35 | 0.27 | 1.89 |
| 24 h swelling value in cationically polymerizable ink (% by weight) | 0.85 | 0.64 | 5.15 |

Table 1 shows that the novel recording materials are distinguished by a short exposure time (ie. high resolution), low hardness typical of flexographic printing plates and low swelling values. The advantages of the novel recording materials were also evident in a comparative printing test with the cationically curable printing ink. For this purpose, the printing plates were clamped on a printing cylinder and used for printing on a conventional flexographic printing unit. The printing material was a polyethylene film. The printing speed was 120 m/minute. While the novel printing plates gave excellent, constant printed copies over a printing time of 1 hour, the printed image of the comparative plate changed after a printing time of only 15 minutes. In particular, the halftone parts printed more strongly with increasing printing time, which can be attributed to insufficient resistance of the material to swelling.

We claim:

1. A photosensitive mixture which contains

A) an elastomeric block copolymer as a binder, having blocks of polymerized
   1. styrene units,
   2. ethylene and butylene units and
   3. diene units, B) a polymerizable compound and C) a compound capable of initiating the polymerization of the compound B under the action of actinic radiation.

2. A photosensitive mixture as claimed in claim 1, wherein the diene units are isoprene units.

3. A photosensitive mixture as claimed in claim 1, wherein the elastomeric block copolymer A contains from 10 to 40% by weight of styrene blocks, from 10 to 70% by weight of alkylene blocks and from 10 to 60% by weight of diene blocks.

4. A photosensitive mixture as claimed in claim 1, which contains from 50 to 95% by weight of binder A, from 5 to 50% by weight of polymerizable compounds B and from 0.1 to 5% by weight of photoinitiators C, based on the total amount of A+B.

5. A photosensitive recording material having a dimensionally stable substrate and a photosensitive layer applied thereon, wherein the photosensitive layer contains A) an elastomeric block copolymer as a binder, having blocks of polymerized
   1. styrene units,
   2. ethylene and butylene units and
   3. diene units, B) a polymerizable compound and C) a compound capable of initiating the polymerization of the compound B under the action of actinic radiation.

6. A photosensitive recording material as claimed in claim 5, wherein the substrate is a polyester film.

7. A photosensitive recording material as claimed in claim 5, which carries a transparent, nontacky release layer on the photosensitive layer.

8. A photosensitive recording material as claimed in claim 5, which carries a removable cover sheet on the uppermost layer.

9. A process for the production of relief images or relief printing plates, wherein a photosensitive recording material as claimed in claim 5 is exposed imagewise to actinic light and, is developed by washing out the unexposed parts of the layer with a developer.

10. A method for printing of printable stock by means of a relief printing plate, in which the image areas of a flexographic relief printing plate which has been produced by the process of claim 9 are inked with a printing ink which contains ester-containing solvents or UV-curable compounds, the printing ink is transferred to the printable stock and the printed image is dried by evaporating the solvent or cured by exposure to UV radiation.

* * * * *

UNITED STATES PATENT AND TRADEMARK OFFICE
CERTIFICATE OF CORRECTION

PATENT NO. : 6,037,101
DATED : March 14, 2000
INVENTOR(S) : TELSER et al.

It is certified that error appears in the above-identified patent and that said Letters Patent is hereby corrected as shown below:

Title page insert item --[30] insert "Foreign Application Priority Data
April 11, 1997[DE] Germany........................197 15 169.8
--.

Signed and Sealed this

Thirteenth Day of February, 2001

Attest:

NICHOLAS P. GODICI

Attesting Officer

Acting Director of the United States Patent and Trademark Office